(12) United States Patent
Maitrejean et al.

(10) Patent No.: US 9,536,951 B2
(45) Date of Patent: Jan. 3, 2017

(54) FINFET TRANSISTOR COMPRISING PORTIONS OF SIGE WITH A CRYSTAL ORIENTATION [111]

(71) Applicant: Commissariat a l'Energie Atomique et aux Energies Alternatives, Paris (FR)

(72) Inventors: Sylvain Maitrejean, Grenoble (FR); Emmanuel Augendre, Montbonnot (FR); Louis Hutin, Saint Martin le Vinoux (FR); Yves Morand, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/849,060

(22) Filed: Sep. 9, 2015

(65) Prior Publication Data

US 2016/0071933 A1 Mar. 10, 2016

(30) Foreign Application Priority Data

Sep. 10, 2014 (FR) ...................................... 14 58487

(51) Int. Cl.
  *H01L 29/10* (2006.01)
  *H01L 29/78* (2006.01)
  *H01L 29/66* (2006.01)
(52) U.S. Cl.
  CPC ..... *H01L 29/1054* (2013.01); *H01L 29/66795* (2013.01); *H01L 29/7853* (2013.01)

(58) Field of Classification Search
  CPC .......... H01L 29/1054; H01L 29/78696; H01L 29/7853; H01L 29/66795
  See application file for complete search history.

(56) References Cited

U.S. PATENT DOCUMENTS

| | | | |
|---|---|---|---|
| 9,219,154 B1 * | 12/2015 | Cheng | ................ H01L 29/7851 |
| 2010/0187503 A1 | 7/2010 | Moriyama et al. | |
| 2013/0234215 A1 * | 9/2013 | Okano | ............. H01L 29/42392 |
| | | | 257/255 |
| 2013/0273722 A1 | 10/2013 | Morand et al. | |
| 2014/0326955 A1 | 11/2014 | Barraud et al. | |
| 2015/0155170 A1 | 6/2015 | Reboh et al. | |
| 2015/0179474 A1 | 6/2015 | Maitrejean et al. | |
| 2015/0179665 A1 | 6/2015 | Reboh et al. | |

OTHER PUBLICATIONS

U.S. Appl. No. 14/791,713, filed Jul. 6, 2015, Shay Reboh et al.

(Continued)

*Primary Examiner* — Roy Potter
*Assistant Examiner* — Paul Patton
(74) *Attorney, Agent, or Firm* — Oblon, McClelland, Maier & Neustadt, L.L.P.

(57) ABSTRACT

FinFET transistor comprising at least:
  one fin that forms a channel, a source and a drain, comprising an alternating stack of first portions of silicon-rich SiGe and of second portions of a dielectric or semiconductor material, and third portions of germanium-rich SiGe arranged at least against lateral faces of the first portions,
  one gate that covers the channel,
  and wherein each one of the third portions comprises faces with a crystal orientation [111] covered by the gate.

14 Claims, 6 Drawing Sheets

(56) References Cited

OTHER PUBLICATIONS

French Preliminary Search Report issued Apr. 30, 2015 in French Application 14 58487, filed on Sep. 10, 2014 ( with English translation of Categories of Documents).
Guilei Wang et al. "Integration of highly-strained SiGe materials in 14nm and beyond nodes Fin FET technology", Solid State Electronics, 103, 2015, 7 pages.
Takashi Sasada et al. "Surface orientation dependence of interface properties of GeO 2/ Ge metal-oxide-semiconductor structures fabricated by thermal oxidation", Journal of Applied Physics, 106, 2009, 8 pages.
Stephan Borel et al. "Control of Selectivity between SiGe and Si in Isotropic Etching Processes", Japanese Journal of Applied Physics, vol. 43, No. 6B, 2004, 4 pages.
S. E. Thompson et al. "Key Differences for Process-induced Uniaxial vs. Substrate-induced Biaxial Stressed Si and Ge Channel MOSFETs", Electron Devices Meeting, IEDM Technical Digest, IEEE International, 2004, 4 pages.

\* cited by examiner

FINFET TRANSISTOR COMPRISING PORTIONS OF SIGE WITH A CRYSTAL ORIENTATION [111]

TECHNICAL FIELD AND PRIOR ART

The invention relates to the field of FinFET transistors (Fin-shaped Field Effect Transistor), as well that of the electronic devices comprising such transistors.

A FET, or field effect transistor, is made by taking several criteria into account: the electrical performance desired, the maximum permissible compactness or the heat dissipation that the transistor has to carry out. A transistor of the FinFET type is a fully depleted transistor that comprises a highly compact structure that makes it possible to maintain good electrostatic control of the transistor, even for advanced technological nodes (28 nm and less). In such a transistor, one or several portions of semiconductor in the form of fins, for example made of silicon, are made on the surface of a substrate. The gate is made by covering the upper face and the lateral faces of a part of the fin or fins that is intended to form the channel of the transistor.

The utilisation of germanium-rich SiGe instead of silicon for making the fin or fins of this type of transistor makes it possible to increase the mobility of the holes in the semiconductor, and therefore improve the performance of the transistor. In order to increase this mobility of the holes even further, it is also possible to use a compression-stressed semiconductor, and advantageously germanium-rich SiGe that is compression-stressed.

However, due to the release of the stresses that are produced in an expitaxial layer of stressed semiconductor when the latter exceeds a certain thickness, it is difficult to make a FinFET transistor fin that is both large, or high, and which comprises SiGe with a high proportion of germanium.

In order to overcome this disadvantage, it is possible to make the or each fin of a FinFET transistor using a first portion of silicon or of silicon-rich SiGe, then to make via epitaxy a second portion of germanium-rich SiGe that covers the first portion of silicon or of silicon-rich SiGe. FIGS. 1A to 2B show the steps implemented to make such a FinFET transistor fin.

Figure 1A:
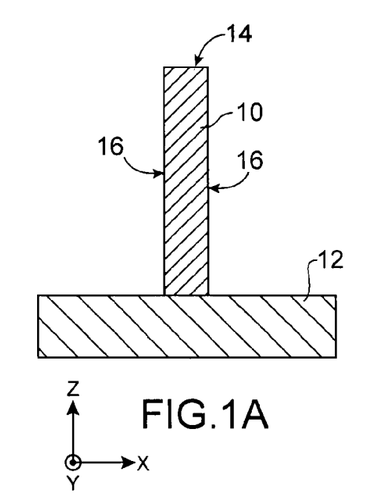
Figure 1B:
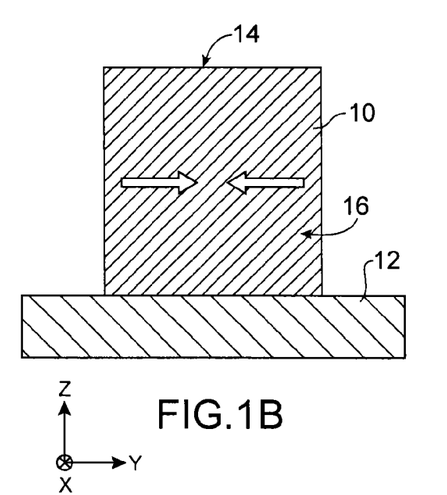

As shown in FIGS. 1A and 1B, the fin of the FinFET transistor intended to form the channel, the source and the drain of the transistor is formed by first making a first portion 10 of silicon-rich SiGe on a silicon substrate 12, by epitaxy. An upper face 14 of this first portion 10 has a crystal orientation [100] and its lateral faces 16 each have a crystal orientation [110]. The SiGe of this first portion 10 is subject to a low compression stress uniaxially. This stress, which is exerted in the direction of the length of the fin (parallel to the axis Y shown in FIGS. 1A and 1B), is represented symbolically par two horizontal arrows in FIG. 1B.

Figure 2A:
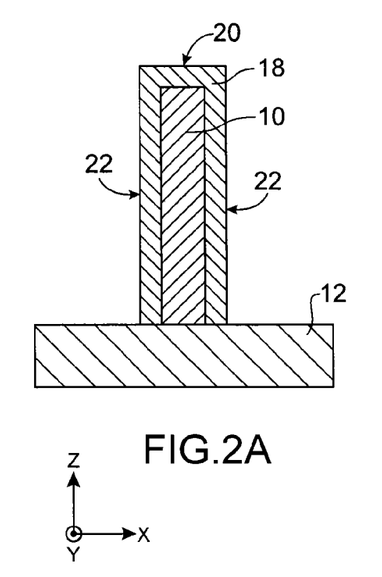
Figure 2B:
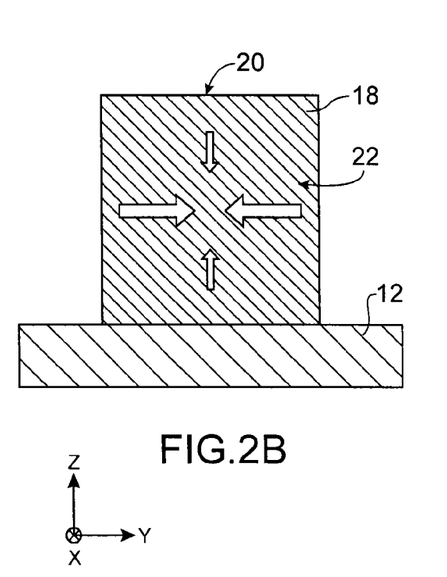

A second portion 18 of germanium-rich SiGe is then made via epitaxy on the first portion 10 (FIGS. 2A and 2B). As for the first portion 10, an upper face 20 of the second portion 18 has a crystal orientation [100] and lateral faces 22 of the second portion 18 have a crystal orientation [110]. The germanium-rich SiGe of the second portion 18 is subject to a high compression stress biaxially. These stresses, which are exerted mostly in the direction of the length of the fin and, to a lesser degree, in the direction of the height of the fin (parallel to the axis Z), are shown symbolically by four arrows on FIG. 2B.

The gate is then made on a part of the upper face 20 and lateral faces 22 of the second portion 18 which forms the channel of the transistor.

A FinFET transistor of which the channel, the source and the drain are formed by such a fin has however several disadvantages. Indeed, this structure implies that the gate is arranged against SiGe with a crystal orientation [110]. However, strong interface states, or surface states, are in this case obtained at the gate-channel interfaces, which limits the mobility of the electrons in the transistor. In addition, the fact that the uniaxial nature of the stress of the semiconductor of the first portion 10 is not retained in the semiconductor of the second portion 18 reduces the mobility of the holes in the fin of the transistor because a biaxial stress is less effective, in terms of hole mobility, than a uniaxial stress.

DISCLOSURE OF THE INVENTION

Thus there is a need to propose a new FinFET transistor of which the fin or fins comprise SiGe with a high proportion of germanium and a strong compression stress regardless of the geometry of the fin or of the fins, and which comprises reduced interface states at the gate-channel interfaces, and therefore good mobility of the electrons and of the holes in the transistor.

For this, one embodiment proposes a FinFET transistor that comprises at least:
  one fin forming a channel, a source and a drain, comprising an alternating stack of first portions of silicon-rich SiGe and of second portions of a dielectric or semiconductor material, and third portions of germanium-rich SiGe arranged at least against lateral faces of the first portions,
  one gate that covers the channel,
  and wherein each one of the third portions comprises faces with a crystal orientation [111] covered by the gate.

The or each one of the fins of this FinFET transistor comprise first portions of silicon-rich SiGe whereon are made third portions of germanium-rich SiGe. As such, this structure makes it possible to have a channel that comprises germanium-rich SiGe with a high compression stress and for which the geometry is not limited in order to prevent a release of the stresses as is the case for a fin formed solely of germanium-rich SiGe.

In addition, due to the fact that the gate is in contact with germanium-rich SiGe with a crystal orientation [111], the interface states at the gate-channel interfaces are substantially reduced with respect to the interfaces between a gate and germanium-rich SiGe with a crystal orientation [110] or [100]. This configuration makes it possible to improve the mobility of the electrons in the transistor.

Because the third portions of germanium-rich SiGe are arranged against lateral faces of the first portions, this configuration enables to make FinFET transistors with a high density. In addition, this configuration does not make more complex the method for making the FinFET transistor. Finally, this configuration enables to stress the channel directly at the channel, which is a better solution than stressing the channel through the source and/or the drain.

The term "lateral faces" designate the faces which are parallel to the axis of alignment of the channel, of the source and of the drain of the transistor (i.e. parallel to the length of the fin), and perpendicular to the faces of the first and second portions which are arranged against one another. These lateral faces correspond to the faces opposite from which the gate is deposited on the sides of the fin, at the channel.

The arrangement of the first portions comprising silicon-rich SiGe and of the second portions comprising a dielectric or semiconductor material according to an alternating stack may be considered as corresponding to an arrangement of at least one of the first portions between two second portions, and of at least one of the second portions between two first portions.

The channel is formed by the parts of the first and of the third portions that are covered by the gate. When the second portions comprise a semiconductor, the channel is also formed by the parts of these second portions which are covered by the gate.

The term "silicon-rich SiGe" may correspond to SiGe of which the proportion of silicon is between about 60% and 100%.

The term "germanium-rich SiGe" may correspond to SiGe of which the proportion of germanium is between about 40% and 100%.

When the second portions comprise semiconductor material, this material may be silicon.

Advantageously, the second portions may comprise dielectric material, which makes it possible to improve the control of the threshold voltage of the transistor and facilitate the making of the transistor.

At least at the channel, each one of the third portions may substantially have the shape of a straight prism with triangular bases, for example isosceles, and comprising three substantially rectangular sides joining said bases, with one of the three sides able to be arranged against one of the lateral faces of one of the first portions and the two others of the three sides able to form the faces with a crystal orientation [111]. The bases of the straight prism formed by each one of the third portions may be isosceles triangles as the angle formed by the sides of the third portions with the main plane of the channel (parallel to said lateral faces of the first portions) is defined by the crystallographic orientations of the materials. The angle between the plane with a crystal orientation [111] and the main plane of the channel is for example equal to about 36°.

At least at the channel, each one of the third portions may substantially have the shape of a straight prism with trapezoidal bases, for example isosceles, and comprising four substantially rectangular sides joining said bases, with one of the four sides able to be arranged against one of the lateral faces of one of the first portions and two others of the four sides, opposite one another, able to form the faces with a crystal orientation [111].

The prisms formed by the third portions may be part of the channel, of the source and of the drain of the transistor. These prisms may have a geometry (in particular in terms of dimensions) which is similar in the channel, the source and the drain, or have, in the channel, a geometry that is different from that in the source and the drain.

At least at the channel, each one of the third portions may be dissociated from one or two third adjacent portions such that the germanium-rich SiGe of the third portions are compression stressed uniaxially. Such a configuration makes it possible to increase the mobility of the holes in the transistor.

In this case, the gate may cover at least a part of the lateral faces of the second portions.

One dimension of the second portions which is substantially perpendicular to the lateral faces of the first portions may be less than a dimension of the first portions which are substantially perpendicular to the lateral faces of the first portions. Such a configuration makes it possible to have a gate that further surrounds the first and third portions, forming a structure close to that of a gate transistor of the "Omega" type, which improves the electrostatic control of the transistor.

At the source and the drain, each one of the third portions may be in contact or be superposed with one or two third adjacent portions. This configuration improves the electrical conductivity of the source and of the drain of the transistor.

At the channel, and/or of the source and of the drain, each one of the third portions may be in contact or be superposed with one or two third adjacent portions.

The gate may cover an upper face of the alternating stack of the first and second portions.

The FinFET transistor may comprise several fins each formed by a stack of first and second portions and by third portions. In this case, the channel, the source and the drain of the transistor are each formed by a part of each one of the fins. In addition, the gate covers in this case the parts of each one of the fins that form the channel of the transistor.

Another embodiment relates to a method of producing a FinFET transistor comprising at least the steps of:
  making of at least one alternating stack of first portions of silicon-rich SiGe and of second portions of a dielectric or semiconductor material,
  making of third portions of germanium-rich SiGe at least against lateral faces of the first portions, such that the alternating stack of the first and second portions and the third portions form a fin intended to form a channel, a source and a drain of the FinFET transistor,
  making of a gate that covers the channel, and such that the gate covers faces with a crystal orientation [111] of each one of the third portions.

The alternating stack of the first and second portions may be made by implementing the following steps:
  making by epitaxy of an alternating stack of first layers of silicon-rich SiGe and of second layers of semiconductor,
  etching of the alternating stack of the first and second layers such that remaining portions of the first and second layers form the alternating stack of the first and second portions.

The semiconductor of the second layers may be different from SiGe, and the making of the alternating stack of the first and second portions may further comprise, after the etching of the alternating stack of the first and second layers, the steps of:
  selective etching of the remaining portions of the second layers in relation to the first portions,
  depositing of portions of the dielectric material in locations formed by the etching of the remaining portions of the second layers such that the portions of the dielectric material form the second portions of the alternating stack of the first and second portions.

The third portions may be made via epitaxy on the lateral faces of the first portions, the duration of the implementation of the epitaxy may be chosen according to the final geometry of the third portions.

The making of the third portions may comprise the implementation of the following steps:
  making of a dummy gate that covers the channel,
  making of a first part of the third portions at the parts of the alternating stack of the first and second portions intended to form the source and the drain,
  depositing of a layer of protection that covers the source and the drain,
  removing the dummy gate,
  making of a second part of the third portions at a part of the alternating stack of the first and second portions intended to form the channel.

As such, it is possible that the geometry of the third portions at the channel is different from that of the third portions at the source and the drain.

BRIEF DESCRIPTION OF THE DRAWINGS

This invention shall be better understood when reading the description of embodiments provided solely for the purposes of information and in no way restricted in reference to the annexed drawings wherein:

FIGS. 1A to 2B show the steps of making a fin of a FinFET transistor of prior art;

Identical, similar or equivalent parts of the various figures described hereinafter bear the same numerical references in such a way as to facilitate switching from one figure to the other.

The various parts shown in the figures are not necessarily shown according to a uniform scale, in order to make the figures more legible.

The various possibilities (alternatives and embodiments) must be understood as not being exclusive from one another and can be combined together.

DETAILED DISCLOSURE OF PARTICULAR EMBODIMENTS

Figures 3A, 3B:
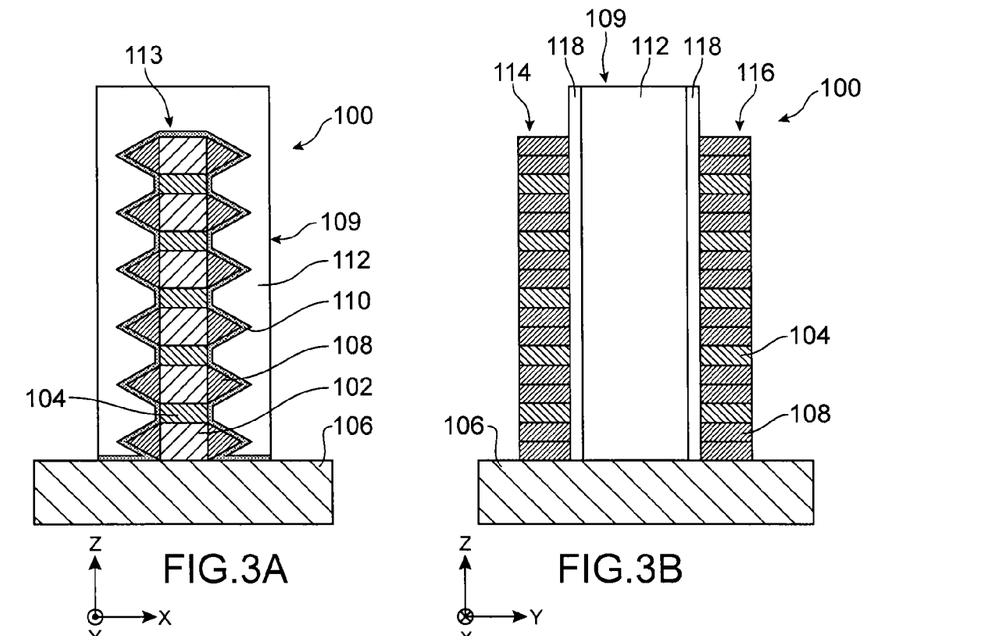
FIGS. 3A and 3B show a FinFET transistor according to a first embodiment.

Reference is first made to FIGS. 3A and 3B which show a FinFET transistor 100 according to a first embodiment. FIG. 3A corresponds to a cross-section view at channel 113 of the transistor 100, and FIG. 3B shows a side view of the transistor 100.

The fin of the transistor 100 that forms the channel 113, the source 114 and the drain 116 of the transistor 100 comprises an alternating stack of first portions 102 of silicon-rich SiGe and of second portions 104 of silicon, arranged on a substrate 106 for example made of silicon. The SiGe of the first portions 102 can comprise a proportion of silicon that is greater than or equal to about 60%. In addition, the SiGe of the first portions 102 is subject to a low compression stress uniaxially, with this stress being exerted in the direction of the length of the fin (parallel to the axis Y shown in FIGS. 3A and 3B), with the value of this stress being a function to the proportion of germanium in the SiGe of the first portions 102 (see the curve 50 of FIG. 12 described hereinbelow).

The height (dimension along the axis Z) of the stack is for example between about 20 nm and 80 nm, and that of each one of the first and second portions 102, 104 is for example between about 4 nm and 15 nm. The width (dimension along the axis X) of the stack (and therefore that of each one of the first and second portions 102, 104) is for example between about 4 nm and 15 nm.

Third portions 108 of germanium-rich SiGe are arranged on the two lateral faces of each one of the first portions 102, i.e. the faces parallel to the plane (Y, Z) and also perpendicular to the face of the substrate 106 whereon the portions 102 and 104 are arranged. The SiGe of the third portions 108 can comprise a proportion of germanium greater than or equal to about 40%.

Each one of the third portions 108 here substantially has the shape of a straight prism with isosceles triangle bases, i.e. comprises a profile (section in the plane (X, Z), or section perpendicular to the two lateral faces of the first portions 102) of a substantially isosceles triangle shape. The two triangular bases of the prism formed are joined by three sides with a substantially rectangular shape. One of these three sides of each one of the prisms is arranged against one of the lateral faces of one of the first portions 102 and the two other sides of each one of the prisms extend until they form an edge opposite this lateral face of one of the first portions 102. The dimension of each one of the third portions 108 extending from the side which is arranged against the lateral face of one of the first portions 102 until its edge (dimension parallel to the X axis, or perpendicular to the lateral face of the first portion 102 whereon is arranged the third portion 108) is for example between about 0.4*a and 1.5*a, with a corresponding to the height of one of the first portions 102.

In this first embodiment, the third portions 108 do not cover the second portions 104. In addition, the third portions 108 are not in contact with one another, and therefore the stress of the SiGe of the third portions 108 is uniaxial in compression in the plane (X,Y) or parallel to the face of the substrate 106 whereon is located the stack of the portions 102 and 104. The stress in the SiGe of the third portions 108 is greater than that in the silicon-rich SiGe of the first portions 102.

Figure 12:
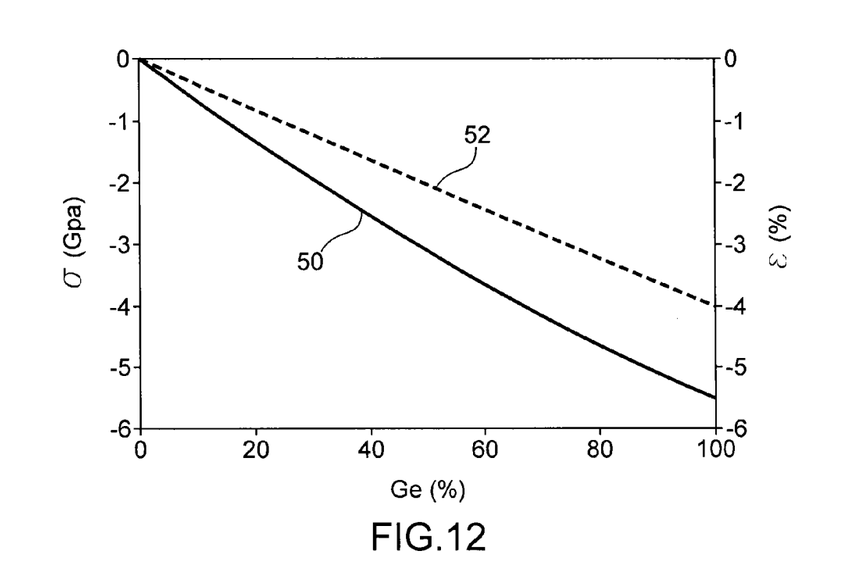
FIG. 12 shows the stress and the compression obtained in the SiGe according to the proportion of germanium in this SiGe.

The curve 50 shown in FIG. 12 corresponds to the stress, in GPa and according to the axis of orientation [110], obtained in SiGe according to the proportion of germanium in this SiGe (in the hypothesis where there is no relaxation of the stresses during the method forming this SiGe). The curve 52 represents the compression obtained, as a %, in this SiGe. The values of the stress and of the compression obtained in the SiGe will therefore be according to the proportion of germanium in the SiGe.

In addition, the epitaxy implemented to form the third portions 108 is such that the SiGe forming the two sides of each one of the third portions 108 which are not arranged against the first portions 102 has a crystal orientation [111] that makes it possible, when this semiconductor is covered by the gate of the transistor 100, to have better mobility of the holes and to reduce the density of the state interfaces (Dit) with respect to SiGe with a crystal orientation [110] or [100].

The parts of the stack of the first and second portions 102, 104 and of the third portions 108 intended to form the channel 113 of the transistor 100 (parts that can be seen in FIG. 3A) are covered by a gate 109 comprising a gate dielectric 110, for example a dielectric with high permittivity ("High-k") such as $Al_2O_3$, $ZrO_2$, $Ta_2O_5$, $HfO_2$, $ZrSi_xO_y$, $Y_2O_3$ or $Ya_2O_3$, and an electrically conductive material 112 such as polysilicon and/or a metal (for example Ta, Ti, Ru, etc.). The electrically conductive material 112 can correspond to one or several superposed layers of electrically conductive materials. The gate dielectric 110 covers the upper face of the stack of the portions 102 and 104 (here the upper face of the first portion 102 located at the top of the stack), the two sides of each one of the third portions 108 which are not arranged against the first portions 102, as well as the lateral faces of the second portions 104. The rest of the stack of the portions 102, 104 and of the third portions 108 forms the source 114 and the drain 116 of the transistor 100. Finally, spacers 118, comprising for example SiN and arranged against the conductor material 112, also cover a part of the stack of the first and second portions 102, 104 and of the third portions 108, at the interfaces between the channel 113 and the source 114 and between the channel 113 and the drain 116.

Figure 4A:
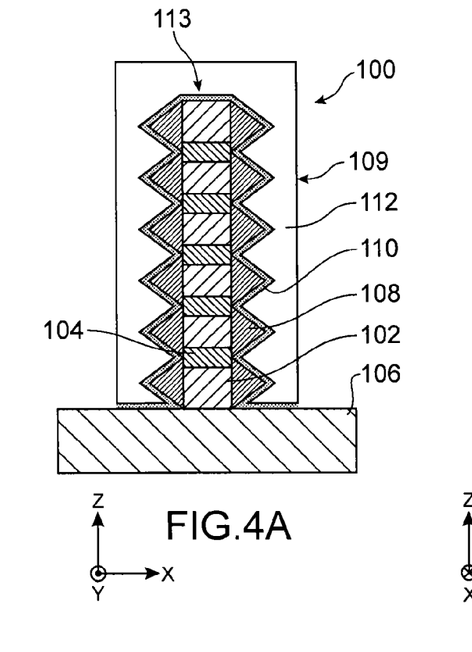
FIGS. 4A and 4B show a FinFET transistor according to a second embodiment.
Figure 4B:
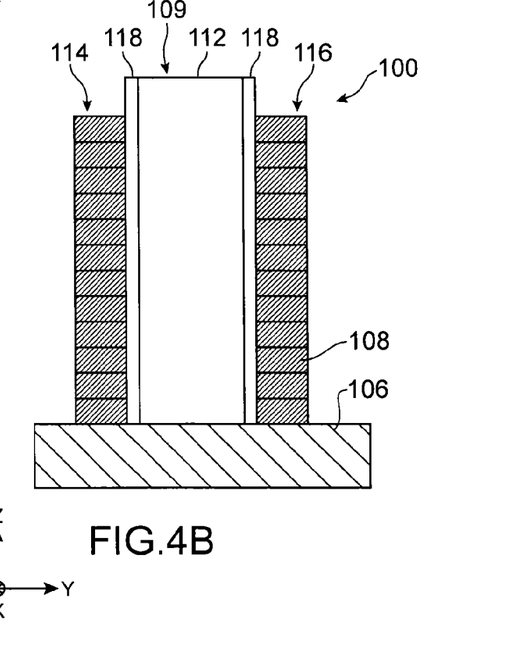

FIGS. 4A and 4B show the FinFET transistor 100 according to a second embodiment. FIG. 4A corresponds to a cross-section view at the channel 113 of the transistor 100, and FIG. 4B shows a side view of the transistor 100.

With respect to the first embodiment described hereinabove, the third portions 108 of the transistor 100 according to the second embodiment cover both the lateral faces of the first portions 102 as well as the lateral faces of the second portions 104. Each one of the third portions 108 is in contact with the third adjacent portion or portions 108. This contact between the third portions 108 can be such that the third adjacent portions 108 overlap.

The gate dielectric 110 therefore covers the upper face of the stack of the portions 102 and 104 and the two faces with a crystal orientation [111] of each one of the third portions 108 which are not arranged against the first portions 102, but is not in direct contact with the lateral faces of the second portions 104.

In this second embodiment, the dimension of each one of the third portions 108 along the axis X (perpendicular to the lateral faces of the first and second portions 102, 104) is greater than about 0.7*(a+b), with a corresponding to the height of one of the first portions 102 and b corresponding to the height of one of the second portions 104.

With regards to the first embodiment described hereinabove, this second embodiment makes it possible to obtain a larger zone of conduction between the fin of the transistor and the gate, and therefore to pass more current in the transistor.

Figures 5A, 5B:
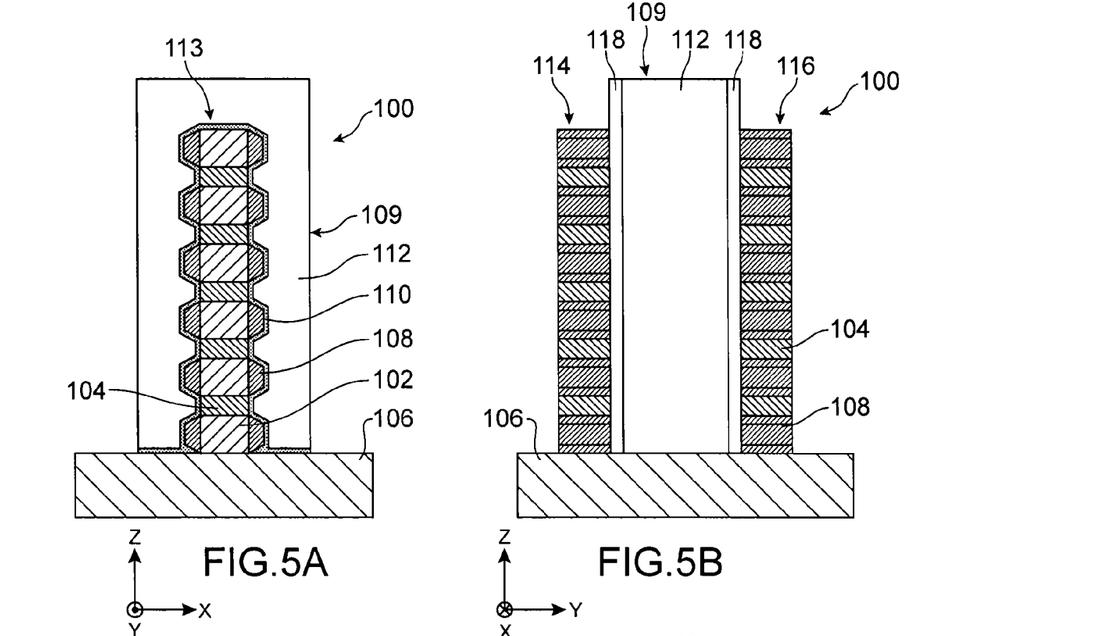
FIGS. 5A and 5B show a FinFET transistor according to a third embodiment.

FIGS. 5A and 5B show the FinFET transistor 100 according to a third embodiment. FIG. 5A corresponds to a cross-section view at the channel 113 of the transistor 100, and FIG. 5B shows a side view of the transistor 100.

With respect to the first embodiment described hereinabove, each one of the third portions 108 substantially has a shape of a straight prism with isosceles trapezoidal bases, i.e. the third portions 108 each have a profile (section in the plane (X,Z), or section perpendicular to the two lateral faces of the first portions 102) with a substantially isosceles trapezoidal shape, with the trapeze formed having its largest base which is arranged against one of the lateral faces of one of the first portions 102. The two trapezoidal bases of the prism formed are joined by four sides with a substantially rectangular shape. One of the four sides of the prism is arranged against one of the lateral faces of one of the first portions 102, and two others of the four sides which are opposite one another form the faces with a crystal orientation [111]. The side of the prism opposite that arranged against one of the lateral faces of one of the first portions 102, i.e. the side of the prism located at the smallest base of the trapeze, has a crystal orientation [110]. The dimension of each one of the third portions 108 according to the X axis (perpendicular to the lateral faces of the first and second portions 102, 104), i.e. the distance between the two bases of the trapeze formed by the profile of each one of the third portions 108 is less than about 0.7*a, with a corresponding to the height of one of the first portions 102.

This third embodiment has for advantage to increase the surface of the third portions 108 in contact with the gate 109, and therefore to pass more courant in the transistor and to have better electrostatic control.

As an alternative to each of the three embodiments described hereinabove, the second portions 104 can comprise a dielectric material, for example $SiO_2$, instead of the semiconductor. Such an alternative has for advantage, for the first and third embodiments, to facilitate the selective growth of the SiGe of the third portions 108 solely on the first portions 102, not on the second portions 104. In addition, for the three embodiments, this alternative makes it possible to better control the value of the threshold voltage of the transistor 100 due to the absence of conduction in the second portions 104, and therefore the absence of voltage thresholds for these second portions 104.

In the first and third embodiments, it is possible that the width (dimension according to the X axis) of the second portions 104 is less than that of the first portions 102. As such, the gate 109 surrounds even more the first portions 102 and the third portions 108, which makes it possible to improve the electrostatic control of the transistor 100. The form of the gate obtained as such is close to that of a gate of the "Omega" type which surrounds a major part of the channel of such a transistor. This alternative is applied in particular when the second portions 104 comprise a dielectric material.

Figures 6A, 6B:
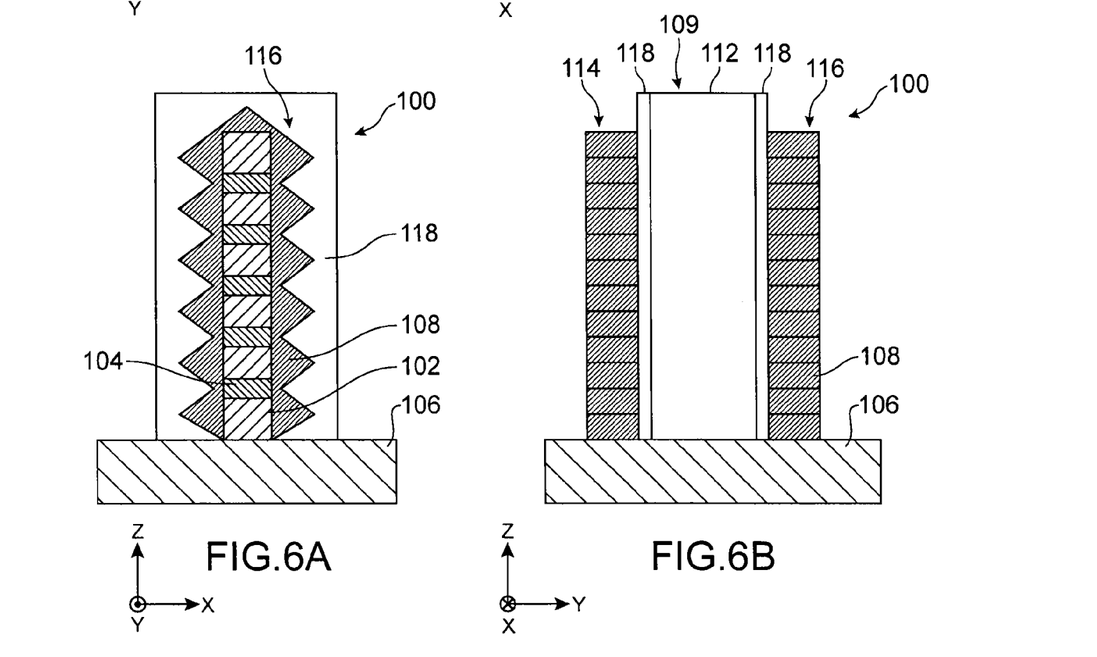
FIGS. 6A and 6B show a FinFET transistor according to an alternative of the first or of the third embodiment.

In the first and third embodiments described hereinabove, the adjacent third portions 108 are not attached to one another, in so much at the channel 113 as at the source 114 and the drain 116. Alternatively, it is possible that the parts of these adjacent third portions 108 located at the source 114 and the drain 116 be attached or be superposed on one another, while the parts of these adjacent third portions 108 located at the channel 113 not be attached or are not superposed on one another. FIG. 6A corresponds to a cross-section view made at the drain 116 of a transistor 100 according to such an alternative. FIG. 6B corresponds to a side view of a transistor 100 according to this alternative. A profile cross-section view of such a transistor at the channel 113 would correspond for example to that of FIG. 3A, 4A or 5A.

A method for producing the transistor 100 according to the first embodiment is described in liaison with FIGS. 7A to 8B.

Figure 7A:
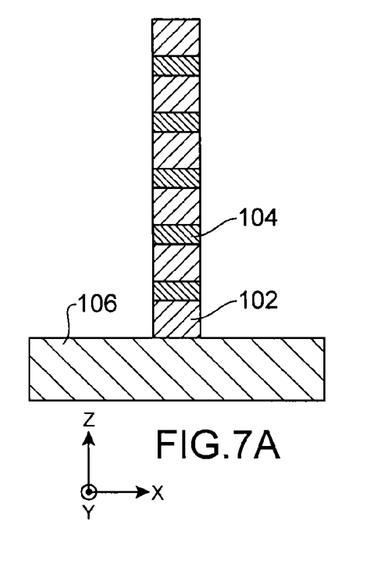
FIGS. 7A, 7B, 8A, and 8B show the steps of a method for making a FinFET transistor according to a particular embodiment.
Figure 7B:
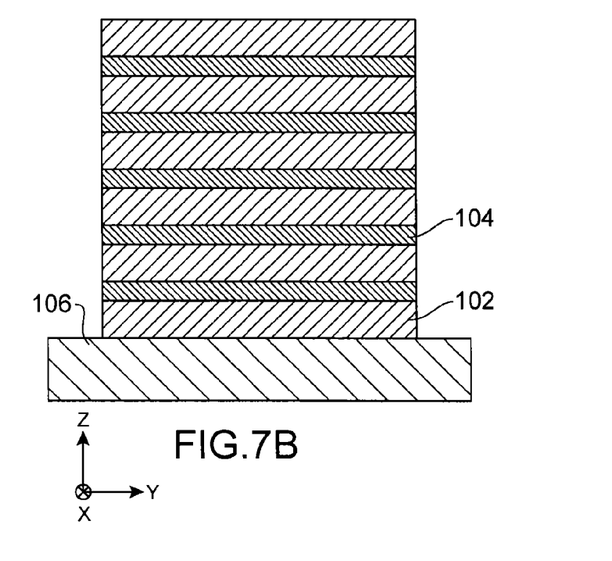

An alternating stack of layers of semiconductor, for example of silicon and of silicon-rich SiGe is formed on the substrate 106, for example by epitaxy. An etching of the stack of layers is then carried out so that the remaining portions of this stack of layers form the alternating stack of the first portions 102 and of the second portions 104 (FIGS. 7A and 7B).

Alternatively, when the second portions 104 are intended to be formed of a dielectric material, the remaining portions of the layers of silicon of the stack can be selectively etched isotropically with respect to the first portions 102. Portions of the stack of layers connected to the portions intended to form the transistor 100 are retained and are not subjected to this selective etching in order to provide for the mechanical maintaining of the first portions 102 after etching of the remaining portions of the layers of silicon of the stack. The dielectric material, for example $SiO_2$, is then deposited, for example by CVD deposition, in the previously etched locations, forming the second portions 104. The portions of dielectric material deposited outside of these locations are etched selectively and isotropically.

A doping (for example in situ or by implantation or plasma) of the first portions 102 can be implemented in order to adjust the threshold voltage which will be obtained in these first portions 102, for example at a value similar to that that will be obtained in the germanium-rich SiGe of the third portions 108.

When the second portions 104 comprise semiconductor, it is possible to carry out a doping of this semiconductor in order to inhibit this semiconductor and prevent an electrical conduction in the latter. Only the first portions 102 of this stack will then be used to form, from an electrical standpoint, the channel, the source and the drain of the transistor.

Figure 8A:
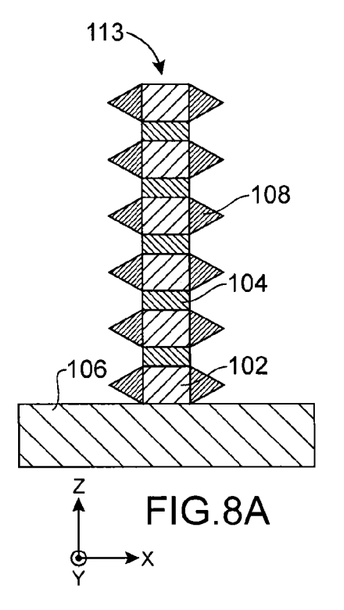
Figure 8B:
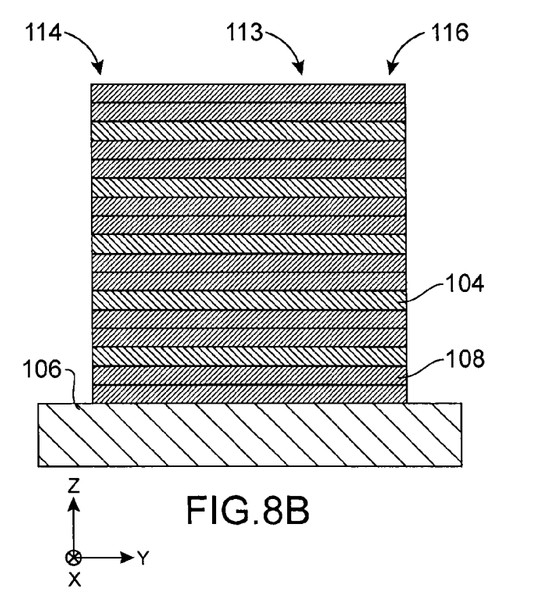

As shown in FIGS. 8A and 8B, the third portions 108 of germanium-rich SiGe are then made via epitaxy on the lateral faces of the first portions 102. The growth via epitaxy implemented is controlled so that the third portions 108 each have a profile with a triangular shape. For the making of the third portions 108 of the transistor 100 according to the second embodiment, this growth is extended until obtaining the desired geometry. On the contrary, for making the third portions 108 of the transistor 100 according to the third embodiment, this growth is interrupted earlier so that the third portions 108 obtained each have a trapezoidal profile.

The epitaxy forming the third portions 108 can be implemented at a temperature between about 500° C. and 750° C. and in the presence of active gases such as SiH$_4$, dichlorosilane, or GeH$_4$. HCl can be used, for example in a cycled manner or introduced at the same time as the active gases, in order to obtain a selectivity relating to the locations where the third portions 108 must be located, for example solely on the lateral faces of the first portions 102. The facets [111] will appear naturally during the epitaxy.

After or before making of the third portions 108, the second portions 104 can be partially etched such that the width of the second portions 104 is less than that of the first portions 102, as described hereinabove.

The transistor 100 is then completed by depositing the gate dielectric 110 in a conformal manner on the upper face of the stack of the first and second portions 102, 104, on the faces of the third portions 108 that are exposed (i.e. all of the faces except those in contact with the stack of the portions 102, 104) and on the lateral faces of the second portions 104, at the channel 113. In the case of the second embodiment wherein the lateral faces of the second portions 104 are covered by the third portions 108, the gate dielectric 110 covers only the upper face of the stack of the first and second portions 102, 104 and the faces of the third portions 108 that are exposed. The gate dielectric 110 is for example formed by a deposit of the ALD (Atomic Layer Deposition) type. The conductor material 112 is the deposited on the gate dielectric 110. The structure obtained corresponds to one of those shown in FIGS. 3A to 5B.

An epitaxy of germanium-rich SiGe can be implemented after the making of the gate so that at the source 114 and the drain 116, the third portions 108 fully cover the faces of the stack of the first and second portions 102, 104, as described hereinabove in liaison with FIGS. 6A and 6B.

An alternative of the method for making the transistor 100 is described hereinbelow.

The steps described hereinabove in liaison with FIGS. 7A and 7B are implemented first.

Figure 9A:
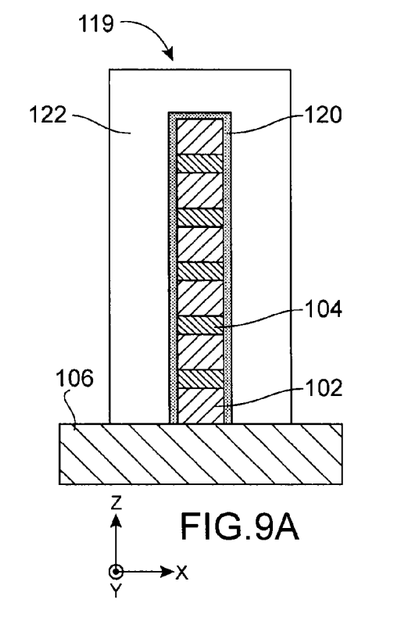
FIGS. 9A, 9B, 10A, 10B, 11A and 11B show the steps for making a FinFET transistor according to an alternative embodiment.
Figure 9B:
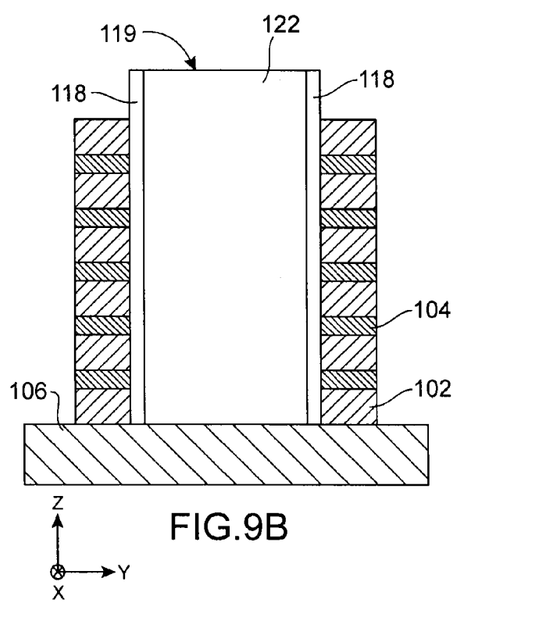

Then, a dummy gate 119 is made, that covers the part of the stack of the first and second portions 102, 104 intended to form the channel 113 of the transistor 100 (FIGS. 9A and 9B). This dummy gate 119 is for example made by forming a first portion 120 of dielectric material, for example SiO$_2$, that covers this part of the stack, then by depositing on the first portion 120 a second portion 122 of material that can be etched selectively with respect to the dielectric material of the first portion 120, for example polysilicon. The spacers 118 are also made against the dummy gate 119, at the interfaces between the channel 113 and the source 114 and between the channel 113 and the drain 116.

An epitaxy of germanium-rich SiGe is then implemented solely at the source and the drain thanks to the presence of the dummy gate 119 that protects the part of the stack of the portions 102, 104 intended to form the channel 113. The parts of the third portions 118 located at the source 114 and the drain 116 are as such formed.

Figure 10A:
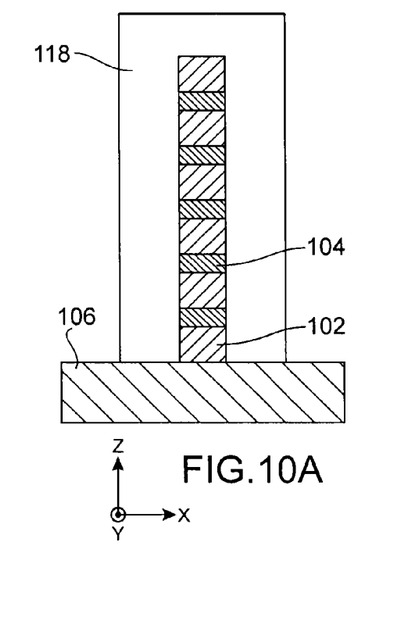
Figure 10B:
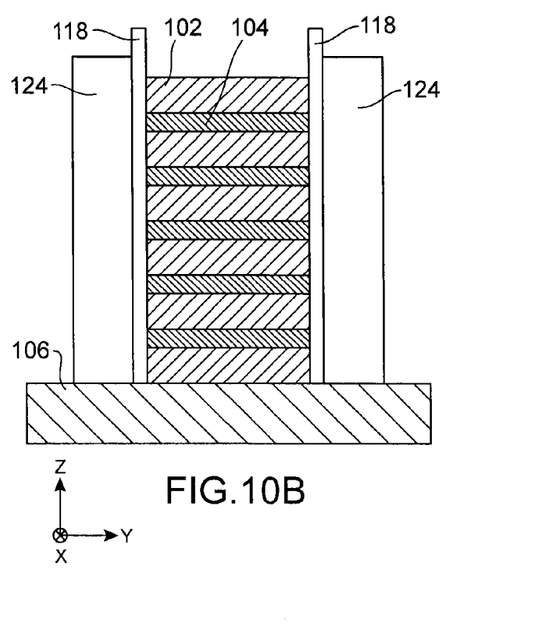

The source 114 and the drain 116 are then protected via a deposit of a layer of protection 124 that comprises for example SiO$_2$, then the dummy gate 119 is suppressed (FIGS. 10A and 10B).

Figure 11A:
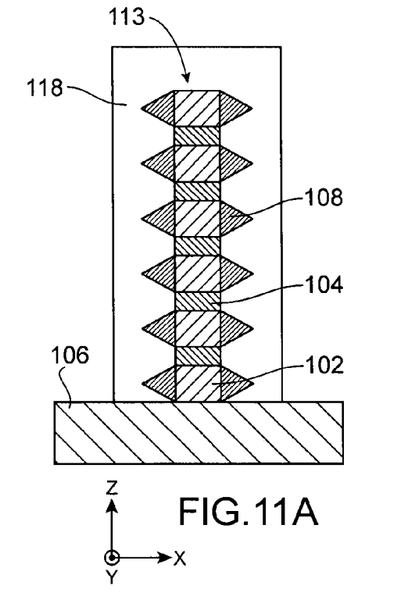
Figure 11B:
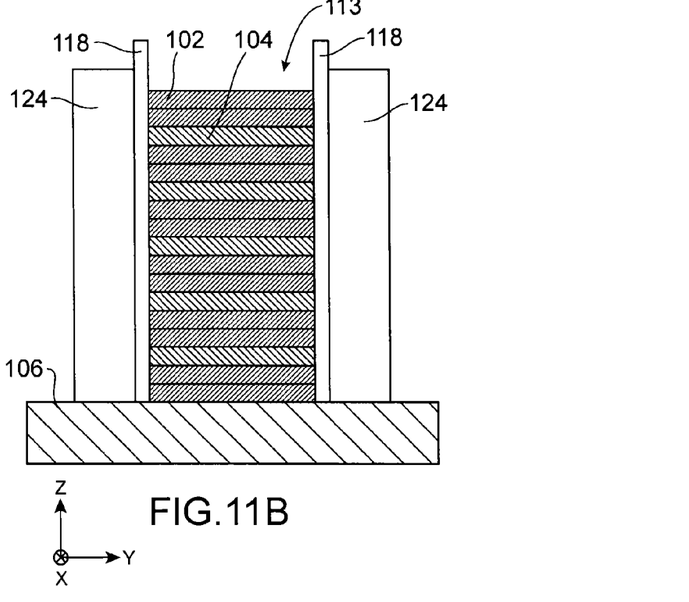

An epitaxy of germanium-rich SiGe is then implemented in order to form the parts of the third portions 108 at the channel 113 (FIGS. 11A and 11B).

The method is completed by making the gate dielectric 110 and the conductor material 112 at the channel 113, then by suppressing the layer of protection 124 that covers the source 114 and the drain 116.

Alternatively, the layer of protection 124 of the source 114 and of the drain 116 can be removed before the implementation of the step of epitaxy of germanium-rich SiGe forming the parts of the third portions 108 at the channel 113, which makes it possible to form germanium-rich SiGe also at the source 114 and the drain 116.

In the examples and embodiments described hereinabove, the FinFET transistor 100 comprises a single fin forming the channel 113, the source 114 and the drain 116. Alternatively, the FinFET transistor 100 can comprise several fins each formed by a stack of first and second portions and by third portions in a manner similar to the fin described hereinabove. In this case, the channel, the source and the drain of the transistor are each formed by a part of each one of the fins. In addition, the gate covers in this case the parts of each one of the fins that form the channel of the transistor.

In the examples and embodiments described hereinabove, the first portions 102 and the second portions 104 have similar dimensions (height along the axis Z, width along the axis X). Alternatively, it is possible that the first portions 102 have dimensions (height and/or width) that differ from those of the second portions 104, or the first portions 102 and/or the second portions 104 do not all have the same dimensions (by carrying out for example the etching of the stack of layers, which form the alternating stack or stacks of the first portions 102 and of the second portions 104, with a certain angle so that the alternating stack or stacks of the first portions 102 and of the second portions 104 have greater dimensions at their base and smaller dimensions at their top, or by protecting the base of the stack or stacks while an etching reduces the dimensions at top of the stack or stacks).

The invention claimed is:

1. A FinFET transistor comprising at least:
   one fin that forms a channel, a source and a drain, comprising an alternating stack of first portions of silicon-rich SiGe and of second portions of a dielectric or semiconductor material, and third portions of germanium-rich SiGe arranged at least against lateral faces of the first portions,
   one gate that covers the channel, and wherein each one of the third portions comprises faces with a crystal orientation [111] covered by the gate.

2. The FinFET transistor according to claim 1, wherein, at least at the channel, each one of the third portions substantially has a shape of a straight prism with triangular bases and comprising three substantially rectangular sides joining said bases, with one of the three sides being arranged against one of the lateral faces of one of the first portions and the two others of the three sides forming the faces with a crystal orientation [111].

3. A FinFET transistor comprising at least:
one fin that forms a channel, a source and a drain, comprising an alternating stack of first portions of silicon-rich SiGe and of second portions of a dielectric or semiconductor material, and third portions of germanium-rich SiGe arranged at least against lateral faces of the first portions,
one gate that covers the channel,
and wherein each one of the third portions comprises faces with a crystal orientation [111] covered by the gate;
wherein, at least at the channel, each one of the third portions substantially has the shape of a straight prism with trapezoidal bases and comprising four substantially rectangular sides joining said bases, with one of the four sides being arranged against one of the lateral faces of one of the first portions and two others of the four sides, opposite one another, forming the faces with a crystal orientation [111].

4. The FinFET transistor according to claim 1, wherein, at least at the channel, each one of the third portions is dissociated from one or two adjacent third portions such that the germanium-rich SiGe of the third portions is uniaxially compression stressed.

5. The FinFET transistor according to claim 4, wherein the gate covers at least a part of the lateral faces of the second portions.

6. The FinFET transistor according to claim 1, wherein one dimension of the second portions which is substantially perpendicular to the lateral faces of the first portions is less than one dimension of the first portions which is substantially perpendicular to the lateral faces of the first portions.

7. The FinFET transistor according to claim 1, wherein, at the source and the drain, each one of the third portions is in contact or is superposed with one or two adjacent third portions.

8. The FinFET transistor according to claim 1, wherein, at the channel, and/or at the source and the drain, each one of the third portions is in contact or is superposed with one or two adjacent third portions.

9. The FinFET transistor according to claim 1, wherein the gate covers an upper face of the alternating stack of the first and second portions.

10. A method for making a FinFET transistor comprising at least the steps of:
making of at least one alternating stack of first portions of silicon-rich SiGe and of second portions of a dielectric or semiconductor material,
making of third portions of germanium-rich SiGe at least against lateral faces of the first portions, such that the alternating stack of the first and second portions and the third portions form a fin intended to form a channel, a source and a drain of the FinFET transistor,
making of a gate that covers the channel, and such that the gate covers faces with a crystal orientation [111] of each one of the third portions.

11. The method according to claim 10, wherein the alternating stack of the first and second portions is made by implementing the following steps:
making by epitaxy of an alternating stack of first layers of silicon-rich SiGe and of second layers of semiconductor,
etching of the alternating stack of the first and second layers such that remaining portions of the first and second layers form the alternating stack of the first and second portions.

12. The method according to claim 11, wherein the semiconductor of the second layers is different from the SiGe, and wherein the making of the alternating stack of the first and second portions further comprises, after etching of the alternating stack of the first and second layers, the steps of:
selective etching of the remaining portions of the second layers with respect to the first portions,
depositing of portions of the dielectric material in locations formed by the etching of the remaining portions of the second layers such that the portions of the dielectric material form the second portions of the alternating stack of the first and second portions.

13. The method according to claim 10, wherein the third portions are made via epitaxy on the lateral faces of the first portions, with the duration of the implementation of the epitaxy chosen according to the final geometry of the third portions.

14. The method according to claim 10, wherein the making of the third portions comprises the implementation of the following steps:
making of a dummy gate that covers the channel,
making of a first part of the third portions at parts of the alternating stack of the first and second portions intended to form the source and the drain,
depositing a layer of protection that covers the source and the drain,
removing of the dummy gate,
making of a second part of the third portions at a part of the alternating stack of the first and second portions intended to form the channel.

* * * * *